United States Patent

Fukuta et al.

[11] Patent Number: 5,879,788
[45] Date of Patent: *Mar. 9, 1999

[54] LOW-TEMPERATURE FIRED CERAMIC CIRCUIT SUBSTRATE AND THICK-FILM PASTE FOR USE IN FABRICATION THEREOF

[75] Inventors: Junzo Fukuta, Nagoya; Masashi Fukaya, Kuwana; Hideaki Araki, Nagoya, all of Japan

[73] Assignee: Sumitomo Metal (SMI) Electronics Devices, Inc., Mine, Japan

[ * ] Notice: The term of this patent shall not extend beyond the expiration date of Pat. No. 5,665,459.

[21] Appl. No.: 816,032

[22] Filed: Mar. 11, 1997

Related U.S. Application Data

[62] Division of Ser. No. 606,798, Feb. 26, 1996, Pat. No. 5,665,459.

[30] Foreign Application Priority Data

Mar. 6, 1995 [JP] Japan ........................ 7-44684

[51] Int. Cl.⁶ ....................................... B32B 7/00
[52] U.S. Cl. .................... 428/210; 428/209; 428/901; 174/257; 501/2
[58] Field of Search ................... 428/210, 209, 428/910, 901; 174/257; 501/2

[56] References Cited

U.S. PATENT DOCUMENTS

| | | | |
|---|---|---|---|
| 3,891,450 | 6/1975 | Trease | 252/518 |
| 4,424,251 | 1/1984 | Sugishita et al. | 428/209 |
| 4,464,420 | 8/1984 | Taguchi et al. | 427/96 |
| 4,621,066 | 11/1986 | Nishigaki et al. | 501/128 |
| 4,795,670 | 1/1989 | Nishigaki et al. | 428/209 |
| 5,439,732 | 8/1995 | Nagasaka et al. | 428/209 |

FOREIGN PATENT DOCUMENTS

| | | |
|---|---|---|
| 0247617 | 2/1987 | European Pat. Off. . |
| 5-69319 | 9/1993 | Japan . |

*Primary Examiner*—William Krynski
*Assistant Examiner*—Cathy F. Lam
*Attorney, Agent, or Firm*—Foley & Lardner

[57] ABSTRACT

A low-temperature fired ceramic circuit substrate fired at a temperature ranging between 800° and 1,000° C. includes a plurality of insulating layers each formed of a low-temperature fired ceramic, an Ag conductor layer formed internally of the substrate, an Au conductor layer formed on a surface of the substrate, and an Ag-Pd layer formed between the Ag and the Au conductor layers, the Ag-Pd layer being composed of 100 parts metal composition consisting of 70 to 95 parts Ag and 5 to 30 part Pd by weight, and 2 to 10 parts lead borosilicate glass by weight. As the result of the above composition of the ceramic circuit substrate, its fabrication process can be simplified, and a defect rate in a connection between the Ag and Au layers after repeated firing is rendered approximately zero, which ensures high reliability for the connection.

7 Claims, 1 Drawing Sheet

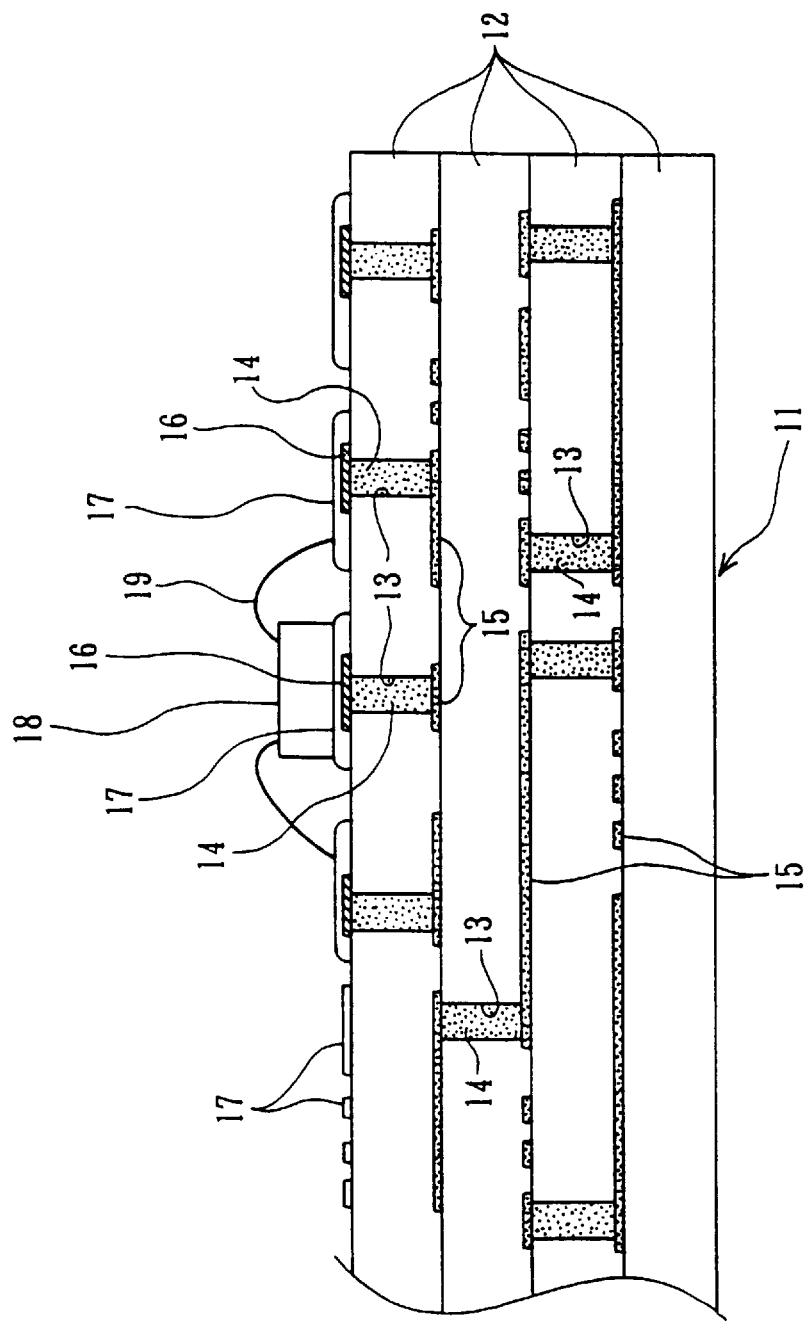
FIGURE

LOW-TEMPERATURE FIRED CERAMIC CIRCUIT SUBSTRATE AND THICK-FILM PASTE FOR USE IN FABRICATION THEREOF

This application is a division, of application Ser. No. 08/606,798, filed Feb. 26, 1996, now U.S. Pat. No. 5,665,459.

BACKGROUND OF THE INVENTION

1. Field of the Invention

This invention relates to a low-temperature fired ceramic circuit substrate formed by co-firing a low-temperature firable ceramic green sheet with Ag wiring conductors, and to a thick-film paste used in the fabrication thereof.

2. Description of the Prior Art

An Ag wiring conductor has good electric characteristics such as a low sheet resistance. However, since the Ag wiring conductor has a melting point lower than a firing temperature (about 1,600° C.) of general ceramic substrates such as an alumina substrate, the Ag wiring conductor cannot be used for the alumina substrate. Tungsten (W) or molybdenum (Mo) each having a higher melting point has been used as the wiring conductors for the alumina substrate. However, these metals with high melting points have high sheet resistances and need to be fired at high temperatures in a reducing atmosphere in order to inhibit oxidation.

To overcome the above-described drawbacks, U.S. Pat. No. 4,621,066 discloses a low-temperature firing ceramic substrate which can be fired in an oxidizing atmosphere at a temperature between 800° and 1,000° C., i.e., at or below the melting point of the Ag wiring conductor. The Ag wiring conductor is co-fired with the low-temperature ceramic circuit substrate. The Ag wiring conductor causes migration under specific conditions, whereas electrode portions and the like on the surface of the substrate require migrationproofing. Accordingly, a film of Au conductor superior in migrationproofing needs to be formed on the Ag conductor of the electrode portions. However, when the Ag conductor is fired with the Au conductor being connected directly thereto, the Kirkendall effect causes Ag atoms to diffuse into the Au conductor, which results in a number of voids formed in the connected surface. Consequently, the reliability in the connection is reduced.

To prevent the above-described problem, Japanese Patent Publication No. 5(1993)-69319 discloses an intermediate layer of metal such as Ni, Cr, or Ti. The intermediate metal layer is formed between the Ag and Au conductors by means of metal plating, sputtering, or the like for preventing diffusion of the Ag atoms into the Au conductor so that the reliability in the connected portion is enhanced.

However, the metal plating or sputtering employed for forming the intermediate metal layer is costly when the same is provided between the Ag and Au conductors, whereupon the cost of the ceramic substrate is increased. It has been considered that a thick-film printing technique may be employed for provision of the intermediate metal layer. However, nickel needs to be fired in an atmosphere of nitrogen for the inhibition of oxidation, which also increases the cost of the ceramic substrate.

Additionally, the substrate is repeatedly fired at a temperature between 800° and 900° C. for the forming of other circuit elements such as resistance after the thick film of the Au conductor has been formed on the intermediate metal layer. The repeated firing sometimes results in breakage or disconnection in a connection between the Ag and Au conductors. Consequently, an enhancement in the reliability of the connection between the Ag and Au conductors has been desired in the ceramic substrate together with reduction in the cost thereof.

SUMMARY OF THE INVENTION

Therefore, an object of the present invention is to provide a low-temperature fired ceramic circuit substrate wherein the fabrication process thereof can be simplified to reduce the cost and the reliability in the connection between the Ag and Au conductors can be enhanced and a thick-film paste for fabrication of the substrate.

To achieve the object, the present invention provides a low-temperature fired ceramic circuit substrate fired at a temperature ranging between 800° and 1,000° C., comprising a plurality of insulating layers each formed of a low-temperature fired ceramic, an Ag thick-film conductor layer formed in the insulating layer and consisting essentially of Ag, an Au thick-film conductor layer formed on a surface of the substrate and consisting essentially of Au, and an Ag-Pd thick-film layer formed between the Ag and the Au thick-film conductor layers and consisting essentially of 100 parts metal composition consisting of 70 to 95 parts Ag and 5 to 30 parts Pd by weight, and 2 to 10 parts lead borosilicate glass by weight.

According to the above-described constitution, the firing atmosphere and temperature for the Ag-Pd thick-film layer interposed between the Ag and Au thick-film wiring conductors can accord with those of the Ag and Au thick-film wiring conductors respectively. Consequently, the Ag-Pd thick-film layer and the Ag wiring conductor can be co-fired which results in simplification and the shortening in the fabrication process of the ceramic substrate.

As obvious from TABLES 1, 2 and 3 which will be shown hereinafter, a defect rate in a connection between the Ag and Au thick film conductors after repeated firing is approximately zero when the thick-film paste comprises 100 parts metal composition consisting of 70 to 95 parts Ag and 5 to 30 parts Pd by weight, 2 to 10 parts lead borosilicate glass by weight, and an organic vehicle. Consequently, high reliability can be ensured with respect to the connection.

A mixture of $CaO$—$SiO_2$—$Al_2O_3$—$B_2O_3$ glass powder and $Al_2O_3$ powder results in anorthite or anorthite and partial crystallization of calcium silicate in the process of firing when the low-temperature firable ceramic green sheets are employed. Consequently, the firing at a low temperature ranging from 800° to 1,000° C. in an oxidizing atmosphere (air) can be realized. Furthermore, the above-described partial crystallization restrains shifts in fine patterns caused in the firing process, and the firing period can be reduced.

BRIEF DESCRIPTION OF THE DRAWINGS

Other objects, features and advantages of the present invention will become clear upon reviewing the following description of preferred embodiments thereof, made with reference to the FIGURE which is an enlarged longitudinal section of a low-temperature fired ceramic circuit substrate of one embodiment in accordance with the present invention.

DETAILED DESCRIPTION OF THE PREFERRED EMBODIMENT

One embodiment of the present invention will be described. Referring to the figure, a ceramic circuit substrate 11 is formed into a multilayer substrate by laminating a plurality of low-temperature firable green sheets 12 each composed as will be described later and then by firing the laminate into an integrated circuit substrate. Each layer of green sheet 12 has via holes 13 formed at predetermined locations thereof by means of punching and having a diameter ranging from 0.05 to 1.00 mm. The via holes 13 are filled with an Ag conductor paste or via 14 so that the layers are electrically connected to one another. A wiring pattern 15 formed of the same Ag conductor paste as the via 14 is provided by means of the screen printing on the surface of each layer of green sheet 12 except for the surface layer. The Ag conductor vias 14 and wiring patterns 15 are co-fired with the laminate of the green sheets 12.

Ag-Pd layers 16 composed as will be described later are printed by a thick film technique on the vias 14 exposed on the surface of the ceramic circuit substrate 11, and then the Ag-Pd layers 16 are fired. Au wiring conductors 17 are patterned on the Ag-Pd layers 16 by a thick film technique. The Au wiring conductors 17 are fired with the fired substrate having the Ag-Pd layers 16. A semiconductor chip 18 is die-bonded on one of the Au wiring conductors 17. Electrodes on the upper surface of the semiconductor chip 18 are connected by bonding wires 19 such as metal wires to the other Au wiring conductors 17.

Fabrication of the above-described low-temperature fired ceramic substrate will be described. A mixture containing 18.2% CaO by weight, 18.2% $Al_2O_3$ by weight, 54.5% $SiO_2$ by weight, and 9.1% $B_2O_3$ by weight was melted at 1,450° C. to be vitrified. Thereafter, the vitrified mixture was rapidly quenched in water and then pulverized into a CaO—$SiO_2$—$Al_2O_3$—$B_2O_3$ glass powder having an average grain diameter of 3 to 3.5 $\mu$m. A ceramic insulator mixed powder was made by mixing 60% of the glass powder and 40% of alumina powder by weight having an average grain diameter of 1.2 $\mu$m. A solvent such as toluene or xylene, a binder such as acrylic resin, and a plasticizer such as DOP were added to the mixed powder. The mixture was sufficiently blended so that a slurry having a viscosity of 2,000 to 40,000 cps was obtained. The slurry was made by a doctor blade process into a green sheet 12 of 0.4 mm thickness.

Subsequently, the green sheet 12 was cut by a punch die or a punching machine into a square with each side of 30 mm length. The via holes each having a diameter of 0.3 mm were formed through predetermined locations on the sheet 12 by means of punching. A binder such as ethyl cellulose and a solvent such as terpineol were previously added to a predetermined amount of Ag powder, and the mixture was sufficiently blended so that an Ag conductor paste was made. The via holes 13 were filled with the conductor paste. The wiring pattern 15 was formed on the surface of the green sheet 12 by means of the screen printing with the same Ag conductor paste. In the same manner as described above, the wiring patterns 15 of the Ag conductor were printed on a plurality of green sheets 12 except the one composing the surface layer. The green sheets 12 were laminated one upon another and then integrated by means of the thermocompression bonding at a temperature of 80° to 150° C. at a pressure of 50 to 250 kg/cm².

Subsequently, the laminate was fired in an oxidizing atmosphere (or air) at a temperature of 800° to 1,000° C. (preferably 900° C.) for 20 minutes with a general electric continuous belt-driven furnace, thereby being formed into a ceramic substrate 11. The sheet resistance of the Ag conductor which was composed of the via 14 and the wiring pattern 15 co-fired with the low firable green sheet was 2.4 mΩ/square, which value was relatively low.

Subsequently, the Ag-Pd layer 16 was printed on the exposed portion of each Ag-conductor via 14 on the surface of the ceramic substrate 11. For this purpose, Ag-Pd paste No. 1 shown in the following TABLE 1 was screen-printed, dried and fired.

TABLE 1

| | | | | | Embodiment | |
|---|---|---|---|---|---|---|
| | Paste composition (weight parts) | | | | | |
| Paste | | | | | Organic vehicle | |
| No. | Ag | Pd | Glass A | Glass B | Binder | Solvent |
| 1 | 95 | 5 | 2 | 0 | Ethyl cellulose 2.0 | Terpineol 21.5 |
| 2 | 70 | 30 | 10 | 0 | Ethyl cellulose 5.0 | Butylcarbitol acetate 30.0 |
| 3 | 80 | 20 | 0 | 5 | Ethyl cellulose 6.0 | Terpineol 30.5 |
| 4 | 80 | 20 | 2 | 3 | Ethyl cellulose 3.5 | Terpineol 22.0 |

| | Glass composition (weight parts) | | | | |
|---|---|---|---|---|---|
| | PbO | $B_2O_3$ | $SiO_2$ | ZnO | BaO |
| Glass A | 70 | 17 | 10 | 3 | 0 |
| Glass B | 75 | 9 | 2 | 12 | 2 |

Furthermore, the wiring pattern 17 was printed on the fired pattern of the Ag-Pd layer 16 using an Au conductor paste. Thereafter, the ceramic substrate 11 was fired for ten minutes at 850° C. in an oxidizing atmosphere or in the air of the electric continuous belt-driven furnace so that the Ag-Pd layer 16 as the intermediate layer and the wiring pattern 17 of the Au wiring conductor were conducted with the via 14 in the ceramic substrate formed of the Ag conductor.

To evaluate the reliability of a connection between the via 14 formed of the Ag conductor 14 and the wiring pattern 17 formed of the Au conductor in the ceramic substrate as fabricated above, an experiment was conducted in which the low-temperature fired ceramic substrate (Embodiment 1) was fired with the resistive $RuO_2$ on the surface at 900° C. for ten minutes. The firing was repeated five times. The connection will be hereinafter referred to as "Ag and Au junction." The result of the experiment was demonstrated to be a defective rate, i.e., the number of defectives/the number of examined junctions due to breakage or disconnection in a wired portion including the Ag and Au junction. Sample Nos. 1 to 4 of the Ag-Pd paste as shown in TABLE 1 were used in the examination. For the purpose of comparison, sample Nos. 5 to 8 as shown in TABLE 2 were also used in the examination.

TABLE 2

Compared examples

Composition of paste (weight parts)

| Paste No. | Ag | Pd | Glass | Organic vehicle | |
|---|---|---|---|---|---|
| | | | | Binder | Solvent |
| 5 | 100 | 0 | 10 | Ethyl cellulose 3.0 | Terpineol 19.0 |
| 6 | 99 | 1 | 5 | Ethyl cellulose 4.0 | Terpineol 21.0 |
| 7 | 60 | 40 | 5 | Ethyl cellulose 4.0 | Terpineol 21.0 |
| 8 | 80 | 20 | 1 | Ethyl cellulose 4.0 | Terpineol 21.0 |

TABLE 3 shows the results of the examination in which the samples shown in TABLES 1 and 2 were repeatedly fired under the above-described conditions.

TABLE 3

| Exam. No. | Type of Ag-Pd layer | Intermediate layer | Results of repeated firing at 900° C. five times (defective rate) |
|---|---|---|---|
| Embodiment | | | |
| 1 | connecting onto via on surface of fired ceramic substrate | Ag-Pd paste No. 1 | 0/10,000 |
| 2 | connecting onto via on surface of green sheet before firing | Ag-Pd paste No. 2 | 0/10,000 |
| 3 | connecting onto via on surface of green sheet before firing | Ag-Pd paste No. 3 | 0/10,000 |
| 4 | connecting onto via on surface of fired ceramic substrate | Ag-Pd paste No. 4 | 0/10,000 |
| Compared examples | | | |
| 1 | connecting onto via on surface of green sheet before firing | Ag paste No. 5 | 64/10,000 |
| 2 | connecting onto via on surface of green sheet before firing | Ag-Pd paste No. 6 | 132/10,000 |
| 3 | connecting onto via on surface of green sheet before firing | Ag-Pd paste No. 7 | 109/10,000 |
| 4 | connecting onto via on surface of green sheet before firing | Ag-Pd paste No. 8 | >200/10,000 |
| 5 | connecting onto via on surface of fired ceramic substrate | None | >200/10,000 |

In each of the examinations Nos. 1 and 4 of the embodiment in TABLE 3, the Ag-Pd layer 16 (intermediate layer) were fired onto the via 14 of the Ag conductor in the fired ceramic substrate 11, and the Au layer was fired onto the fired ceramic substrate with the Ag-Pd layers. In each of the examinations Nos. 2 and 3 of the embodiment, the pattern of the Ag-Pd layer 16 was screen printed on the via 14 of the Ag conductor exposed at the surface of the firable green sheet 12 using an Ag-Pd paste No. 2 and No. 3 as shown in TABLE 1, and then was co-fired with the laminated green sheet 12. The wiring pattern 17 of the Au conductor is further screen printed on the fired pattern of the Ag-Pd layer 16.

In examination Nos. 1 to 4 of the compared examples, the firing was carried out using the respective Ag and Pd paste Nos. 5 to 8 in the same manner as in the examination Nos. 2 and 3 of the embodiment. In the examination No. 5 of the compared examples, the wiring pattern 17 of the Au conductor was directly formed on the via 14 of the Ag conductor on the fired ceramic substrate without use of the Ag-Pd layer 16.

As obvious from TABLE 3, the number of defectives in 10,000 Ag and Au junctions is zero in each of the examinations Nos. 1 to 4 of the embodiment. It is confirmed that the Ag-Pd layer 16 serving as the intermediate layer can enhance the reliability of the Ag and Au junction. The paste serving as the Ag-Pd layer 16 providing the above-mentioned high reliability of the Ag and Au junction comprises 100 parts metal composition consisting of 70 to 95 parts Ag and 5 to 30 parts Pd powder by weight, and 2 to 10 parts lead borosilicate glass by weight. The grain diameter of each of Ag and Pd powder ranges between 0.1 and 10 $\mu$m. The Ag-Pd paste may be a Ag-Pd alloy powder or a mixed powder of Ag and Pd.

The glass powder is preferably a lead borosilicate (PbO—$SiO_2$—$B_2O_3$) glass powder. The principal component of the lead borosilicate glass includes PbO, $SiO_2$, and $B_2O_3$ with additives of $Al_2O_3$, $ZrO_2$, $TiO_2$, $Ta_2O_3$, CaO, ZnO, BaO, and the like which are added for the provision of waterproofing and for the changes in the coefficient of thermal expansion. The quantity of lead borosilicate glass is preferably 2 to 10 parts by weight. The degree of binding between Ag and Au is lowered when the quantity of lead borosilicate glass is below 2 parts by weight. On the other hand, there is a possibility of the occurrence of breakage or disconnection due to repeated firing when the quantity of lead borosilicate glass is over 10 parts by weight.

A binder of the organic vehicle in the Ag-Pd paste is preferably ethyl cellulose, and a solvent thereof is preferably butylcarbitol, acetate, or terpineol. Other binders which can be screen printed may be used.

Each of the green sheets 12 composing the ceramic substrate 11 preferably consists of a mixture of CaO—$SiO_2$—$Al_2O_3$—$B_2O_3$ glass powder and $Al_2O_3$ powder. The mixture is preferably composed of 50 to 65% glass powder by weight consisting of 10 to 55% CaO, 45 to 70% $SiO_2$, 0 to 30% $Al_2O_3$, and 5 to 20% $B_2O_3$ by weight, and 50 to 35% $Al_2O_3$ powder. When the green sheet 12 composed as described above is used, anorthite is produced or calcium silicate is partially crystallized with the production of anorthite in the process of the firing. Consequently, the firing at a low temperature between 800° and 1,000° C. in an oxidizing atmosphere (air) is rendered possible. Furthermore, the above-described partial crystallization of the calcium silicate restrains shift in fine patterns caused by the firing process, and the firing period can be reduced. Consequently, a fine wiring pattern can be readily formed. Furthermore, the glass layer does not soften nor shrink thereby maintaining its porosity in the temperature range of 730° to 850° C. during firing even when the firing temperature is raised at such a high rate by 30° to 50° C. per minute. Consequently, the glass layer can be prevented from being cracked, and carbon can be prevented from being trapped in the glass layer, whereupon the binder can be readily removed. Additionally, since shrinkage and sintering are caused to rapidly take place at a firing temperature of 800° to 1,000° C., a fine ceramic substrate can be obtained in a short period of time.

In the Figure, the wiring pattern 17 of the Au conductor is formed on one side of the ceramic substrate with the Ag-Pd layer 16 being interposed therebetween in the foregoing embodiment. The wiring patterns 17 may be provided on both sides of the substrate with the Ag-Pd layers being interposed therebetween. Furthermore, the number of green sheets laminated may be varied.

The foregoing description and drawings are merely illustrative of the principles of the present invention and are not to be construed in a limiting sense. Various changes and modifications will become apparent to those of ordinary skill in the art. All such changes and modifications are seen to fall within the true spirit and scope of the invention as defined by the appended claims.

We claim:

1. A low-temperature fired ceramic circuit substrate comprising:

a plurality of insulating layers each formed of a low-temperature fired ceramic fired at a temperature ranging between 800° and 1,000° C.;

an Ag thick-film conductor layer filling a via hole of the insulating layer and consisting essentially of Ag, the Ag thick-film conductor layer being co-fired with the insulating layers;

an Ag-Pd thick-film layer formed on an exposed portion of the Ag thick-film conductor layer and consisting essentially of:

(a) 100 parts metal composition consisting of 70 to 95 parts Ag and 5 to 30 parts Pd by weight; and (b) 2 to 10 parts lead borosilicate glass by weight; and an Au thick-film conductor layer formed on the Ag-Pd thick-film layer and consisting essentially of Au.

2. A substrate according to claim 1, wherein each insulating layer is formed by firing a mixture of CaO—$SiO_2$—$Al_2O_3$—$B_2O_3$ glass and $Al_2O_3$ at a temperature ranging between 800° to 1,000° C.

3. A substrate according to claim 1, wherein the Ag-Pd thick-film layer is fired on the surface of the insulating layers after the same has been co-fired with the Ag thick-film conductor layer, and then the Au thick-film conductor layer is fired.

4. A substrate according to claim 1, wherein the insulating layers, the Ag thick-film conductor layer and the Ag-Pd thick-film layer are co-fired, and then the Au thick-film conductor layer is fired.

5. A substrate according to claim 1, wherein the Ag-Pd thick-film layer covers Ag via conductors in a surface layer of the substrate and the Au thick-film conductor layer is formed on the Ag-Pd thick-film layer covering the Ag via conductors.

6. A thick-film paste used for forming an Ag-Pd layer further used for forming an Au wiring conductor with respect to an Ag wiring conductor formed internally of a ceramic circuit substrate with the Ag-Pd layer being interposed therebetween, the thick-film paste comprising 100 parts metal composition consisting of 70 to 95 parts Ag and 5 to 30 parts Pd by weight, 2 to 10 parts lead borosilicate glass by weight, and an organic vehicle.

7. A thick-film paste used for forming an Ag-Pd thick-film layer between an Ag thick-film conductor layer and an Au thick-film conductor layer, the Ag thick-film conductor layer being formed internally of a ceramic circuit substrate, and the Au thick-film conductor layer being formed on a surface of the substrate, the thick-film paste consisting essentially of 100 parts metal composition consisting of 70 to 95 parts Ag and 5 to 30 parts Pd by weight, 2 to 10 parts lead borosilicate glass by weight, and an organic vehicle.

* * * * *